United States Patent [19]

Hagiwara et al.

[11] Patent Number: 4,656,607
[45] Date of Patent: Apr. 7, 1987

[54] ELECTRICALLY ERASABLE PROGRAMMABLE RAM

[75] Inventors: Takaaki Hagiwara, Nishitama; Toru Kaga, Kokubunji; Hiroo Masuda, Nishitama, all of Japan

[73] Assignee: Hitachi, Ltd., Tokyo, Japan

[21] Appl. No.: 632,317

[22] Filed: Jul. 19, 1984

[30] Foreign Application Priority Data

Jul. 21, 1983 [JP] Japan .................. 58-133357

[51] Int. Cl.[4] .............................. G11C 11/40
[52] U.S. Cl. .................... 365/182; 365/185; 357/23.5
[58] Field of Search ............... 365/182, 184, 185, 102, 365/104; 357/23.5, 23.7

[56] References Cited

U.S. PATENT DOCUMENTS 4,507,758  3/1985  Moeschwitzer .................. 365/182

FOREIGN PATENT DOCUMENTS 0083075  7/1981  Japan .................. 357/23.7
0088355  7/1981  Japan .................. 365/182
0114374  9/1981  Japan .................. 357/23.7

Primary Examiner—Terrell W. Fears
Attorney, Agent, or Firm—Antonelli, Terry & Wands

[57] ABSTRACT

In a semiconductor memory made up of semiconductor memory elements, each consisting of a transistor of an MOS structure which has a charge-storage layer and which is formed on a semiconductor substrate, the improvement wherein a switching element is provided so that positive or negative charge can be stored or discharged from the charge-storage layer in a mode for writing data, and the charge-storage layer can be allowed to float electrically when in a mode for reading data.

11 Claims, 15 Drawing Figures

ELECTRICALLY ERASABLE PROGRAMMABLE RAM

BACKGROUND OF THE INVENTION

This invention relates to a semiconductor memory unit for use in a semiconductor memory, and more particularly to a semiconductor memory unit (hereinafter called "memory cell") of the type which stores data by temporarily holding a charge.

The so-called "dynamic RAM" (hereinafter called "DRAM") has been used widely in the past as a memory cell. FIG. 1A is a section through the structure of a DRAM, and FIG. 1B is a circuit diagram of an equivalent circuit thereof. In FIG. 1A, reference numeral 11 denotes a semiconductor substrate, 12 the gate of a switching transistor, 13 the plate of a capacitor, and 14 an impurity-doped region forming a bit line. 15 and 19 denote insulating films, and 16 denotes an impurity-doped region. Reference numerals 12', 13' and 14' in FIG. 1B correspond to reference numerals 12, 13 and 14 in FIG. 1A, respectively.

A DRAM with this structure operates in the following manner. Data is written by injecting charge into the capacitor 18 with the transistor 17 acting as a switching element. In reading mode, while the bit line 14 (14') is kept in a floating condition, the switch 17 is opened and the charge stored in the capacitor 18 is passed to the bit line 14 (14'). The change in potential of the bit line 14 (14') is then detected to determine whether or not a charge had been stored, and these two states are made to correspond to data "1" and "0".

Although DRAMs are the most commonly used memory devices at present, problems inherent to this type of device have become all the more critical as the integration density of large-scale integrated (LSI) circuits has improved, and the miniaturization of devices has increased. These problems will be described next in detail.

A first problem is that since the structure of the DRAM is such that a charge stored in a capacitor is used as the signal, the storage capacitance of the capacitors drops as the element pattern is scaled down and, together therewith, the signal strength also drops so that data read-out becomes more difficult. The ratio of storage capacitance to bit line capacitance is normally used as a quantity indicating the characteristics of a DRAM memory cell. Whereas the bit line capacitance does not usually vary much with the scale-down of the elements, the storage capacitance does drop, so that this capacitance ratio drops as the elements are scaled down, and read-out becomes difficult.

A second problem is that a DRAM is susceptible to radioactivity such as α-rays emitted from materials placed close to its chip or package, and the charges induced by radioactivity can destroy the memory cell data. This is one of the reasons why the value of the storage capacitance can not be reduced.

A third problem is that since the data stored in the DRAM memory cell is cleared when it is read out, data that is the same as the read-out data must be rewritten (refreshed). This results in another problem that the actual read-out speed of a DRAM is slow.

A memory cell called an "EPROM" (Erasable and Programmable ROM) is known as a memory cell which solves these problems. FIG. 2A shows a section through the structure of such a memory cell, and FIG. 2B, an equivalent circuit. In the drawings, reference numeral 21 denotes a semiconductor substrate, 22 a control gate, 23 a drain, 25 a source, 26 an insulating film, and 24 a floating gate. As is obvious from the drawings, an EPROM is characterized in that the floating gate 24 for storing the charge is provided between the gate 22 and the substrate 21 in a MIS (Metal Insulator Silicon) structure. This memory cell detects the logic values "1" and "0" by utilizing changes in a threshold voltage $V_{th}$, viewed from the control gate, when charge is stored in the floating gate 24.

FIG. 3 shows the principle of this memory cell. Voltage $V_g$ applied to the gate is plotted along the abscissa while drain current $I_d$ is plotted along the ordinate. Curve 31 shows the characteristic of an erased condition, and curve 32 that of a written condition. In reading mode, a 5 V voltage is applied to the gate 22 and whether or not a current flows between the drain 23 and the source 25 is detected.

The first characterizing feature of an EPROM of this structure is that since the signal charge, the charge stored in the floating gate 24, is read out after being converted into a current, the quantity of this charge can be small, and hence a large storage capacitance is not necessary. The second characterizing feature is that since the charge storage portion is isolated by the insulating film, the memory cell is resistant to radioactivity such as α-rays. The third characterizing feature is that data can be read out as often as required because it is not destroyed by the read.

In comparison with a DRAM, therefore, an EPROM has various advantages and is close to being an ideal memory cell. In practice, however, EPROMs have been used exclusively as read-only memories because data is written by avalanche injection and, moreover, electrical erasure of data is not possible.

SUMMARY OF THE INVENTION

A high-speed memory cell enabling further miniaturization could be obtained if the charge-current conversion function, the isolation of the charge storage portion from the substrate, and the non-destructive read-out function of an EPROM memory cell could be added to a DRAM memory cell.

With the background and conce-ot described above, the present invention is directed to providing a semiconductor memory consisting of memory cells which have the advantages of both DRAMs and EPROMs, that is, a charge-current conversion function, a high resistance to radioactivity such as α-rays, and a non-destructive data read-out function.

This object of the present invention can be accomplished by a memory cell which is characterized in that a memory element consisting of a field-effect transistor of an MIS structure which has a floating gate and is formed on a semiconductor substrate is provided with a switching element which stores or discharges positive or negative charge into and from the floating gate when in writing mode, and which electrically isolates the floating gate from the other elements when in reading mode.

DESCRIPTION OF THE PREFERRED EMBODIMENTS

Hereinafter, some preferred embodiments of the present invention will be described in detail with reference to the accompanying drawings.

Figure 4:
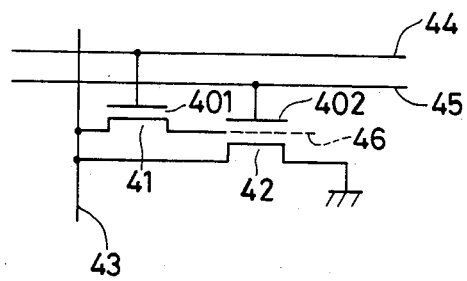
FIG. 4 is a circuit diagram of a memory cell in accordance with a first embodiment of the present invention.

FIG. 4 is a circuit diagram of a memory cell in accordance with a first embodiment of the present invention.

In a practical semiconductor memory, a plurality of memory cells are arranged in a matrix, a plurality of word lines each connecting control terminals of the memory cells of the same column and a plurality of bit lines (data input-output lines) each connecting input-output terminals of the memory cells of the same row are also provided, and decoders for selecting the word and bit lines, address buffers, sense amplifiers for detecting signals, a write circuit, a data input-output circuit, a timing control circuit, etc., are arranged around the memory cell matrix. The circuits of conventional DRAMs or EPROMs can be used as these circuits.

The memory cell of this embodiment consists of a switching transistor 41 and a memory transistor 42. Reference numeral 43 denotes a bit line (data input-output line), 44 a writing word line, 45 a reading word line, and 46 a floating gate. The gate 401 of the switching transistor consisting of a field-effect transistor of an MIS structure (MIS transistor) is connected to the writing word line 44, either its source or its drain is connected to the bit line 43 acting as the data input-output line, and the other is connected to a floating gate of the memory transistor. In the memory transistor which similarly consists of a field-effect transistor of the MIS structure and is provided with a control gate 402 and the floating gate 46, the control gate is connected to the reading word line while either its source or its drain is connected to the bit line acting as the data input-output line 43, and the other is set at a predetermined potential such as ground potential.

It is advisable to use MOS (Metal-Oxide Semiconductor) field-effect transistors, which have oxide films as their gate-insulating films, for these MIS transistors.

The memory cell of this embodiment differs from the EPROM described above in that the switching element consisting of a MIS field-effect transistor is connected to the floating gate 46, so that charge injection to the floating gate can be done at a low voltage.

The operation of the memory cell of FIG. 4 will now be described. In writing mode, the reading word line 45 is grounded and a predetermined voltage (e.g., 5 V) is applied to the writing word line 44. Under this state, the potential of the bit line 43 is transmitted unchanged to the floating gate 46, and hence "0" and "1" data can be written by either grounding the bit line potential (low level: "L" level) or raising it to a high potential such as 5V (high level: "H" level).

In other words, since the switching transistor 41 is turned on and the memory transistor 42 off, the potential of the floating gate 46 drops to ground potential when the bit line 43 is grounded, and the potential of the floating gate 46 rises to a high potential when the bit line 43 is held at that high potential. In this way, data can be stored in each memory cell.

In reading mode, the writing word line 44 is grounded and a predetermined potential (e.g., 5 V) is applied to the reading word line 45. The bit line 43 is precharged to a predetermined potential by a sense amplifier connected thereto. If no charge is stored in the floating gate 46 (if the data value stored therein is "0"), the memory transistor 42 is turned off, and hence the bit line 43 is kept at the precharged potential. On the other hand, if charge is stored in the floating gate 46 (if the data value stored therein is "1"), the memory transistor 42 is turned on, and the potential of the bit line 43 drops. Accordingly, the potential of the bit line 43 changes in accordance with the logical values "0" and "1" of the memory data.

Figure 5:
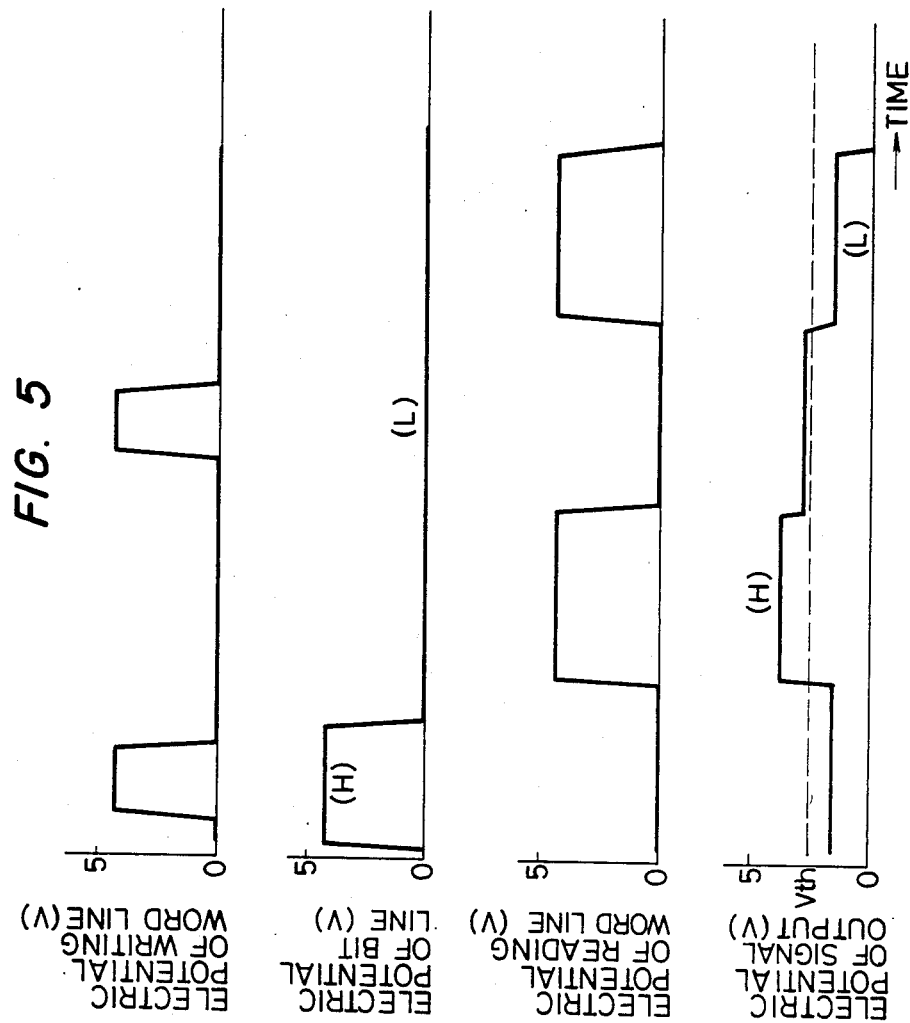
FIG. 5 is an operational waveform diagram of the memory cell of FIG. 4.

FIG. 5 shows the operational waveforms of the memory cell of this embodiment. The chart shows the state in which after "H" level write and read are executed, "L" level write and read are executed. (A) shows the potential of the writing word line 44; (B) that of bit line indicating the writing signal; (C) that of the reading word line 45; and (D) shows the signal output obtained by an output circuit which processes the potential of the bit line 43. The threshold voltage $V_{th}$ in reading mode is set to 2.5 V.

In this embodiment, the node of whichever of the source and drain of the memory transistor 42 which is not connected to the bit line 43 is held at ground potential, but the memory cell can be operated in substantially the same way when the node is held at any other potential, such as the power source potential.

The memory cell of this embodiment has the following advantages over the DRAM described previously.

(1) In a DRAM, a stored charge is passed to the bit line and the consequent change in potential is detected. In the memory cell of this embodiment, on the other hand, the writing word line 44 is grounded during reading mode, so that the charge in the floating gate 46 does not change, even when reading is effected, and static read-out is therefore possible.

(2) Since a DRAM uses a system in which charge is stored, a quantity of stored charge exceeding a certain predetermined level is necessary. If the storage capacitance drops as the element pattern is scaled down, therefore, it becomes difficult to ensure a sufficient charge quantity. This problem concerning charge quantity does not occur in this embodiment of the present invention, and no limitation is imposed on the scaling-down, because data is stored in accordance with the potential of floating gates.

(3) As described below, the memory cell of this embodiment has a structure in which a charge storage portion is isolated from the substrate. For this reason, the memory cell is not affected by radioactivity so that the stored data is not destroyed thereby.

Figure 6:
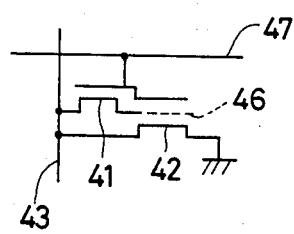
FIG. 6 is a circuit diagram of a memory cell in accordance with a second embodiment of the present invention.

FIG. 6 is a circuit diagram of a second embodiment of the present invention. It differs from the first embodiment of FIG. 4 in that the reading word line 45 and writing word line 44 of the first embodiment are integrated, and the memory cell can be operated in the same way as that of the first embodiment of FIG. 4 by setting the threshold voltage of the switching transistor 41 to a level higher than that of the memory transistor 42. In other words, the word line 47 is set to a predetermined potential (e.g. 3 V) in reading mode, and the data is read out by utilizing the property that the transistor 42 is turned on or off according to the level of the potential of the floating gate 46. If the threshold voltage of the transistor 41 is set to a level higher than at least 3 V in this instance, the transistor 41 is never turned on, and hence the data value it holds will not be destroyed. In writing mode, the potential of the word line 47 is set to be higher than the threshold voltage of the transistor 41.

Figure 7:
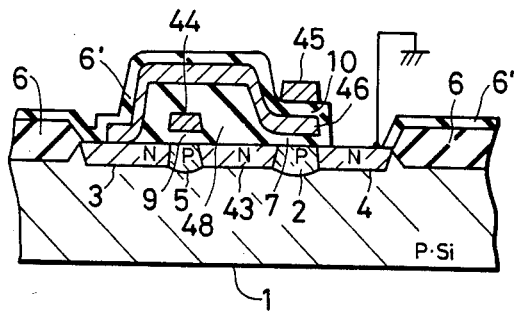
FIGS. 7, 8, 10, 12A and 12B are sections through a specific structure of the memory cell of FIG. 4.

Hereinafter, a specific example of the construction of this circuit will be described. FIG. 7 is a section through the structure of the memory cell of FIG. 4. In the drawing, reference numeral 1 denotes a silicon substrate of p-type conductivity, and 3, 4 and 43 denote impurity-doped layers of n-type conductivity, with the layer 43 functioning as the bit line. Reference numerals 44, 45 and 46 denote the writing word line, reading word line, and floating gate, respectively, which are made of polycrystalline silicon or metal. Reference numeral 2 denotes an impurity-doped layer for controlling the threshold voltage of a reading transistor 42, while reference numeral 5 denotes an impurity-doped layer for controlling the threshold voltage of a writing transistor 41. Although this is not essential, they are usually of the same conductivity type as the substrate, and each consist of a highly doped layer of a higher concentration than the substate which is formed by an ion implantation technique. Reference numerals 6' and 48 denote insulating films of a substance such as $SiO_2$. Reference numeral 6 denotes an oxide film for isolating adjacent cells. Metal wiring denoted by reference numerals 6' and 47 are not specifically depicted.

Figure 8:
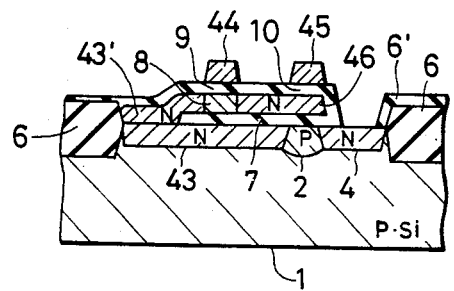

FIG. 8 is a section through an example of the structure in which the memory cell of FIG. 4 is realized by an SOI (Silicon on Insulator) technique. In the drawing, reference numerals 7, 9 and 10 denote interlayer insulating films (hereinafter called "insulating films") that act as gate insulating films. Reference numerals 43', 46 and 8 denote a monocrystalline silicon layer and the other reference numerals denote the same constituents as those in FIG. 7.

The memory cell of this embodiment can be fabricated in the following manner. After the n-type layer 43 and the p-type impurity-doped layer 2 for controlling the threshold voltage are formed on the p-type silicon substrate 1, the insulating film 7 is formed, and then the p-type monocrystalline silicon layer 8, 43' and 46, is formed on the insulating film 7. The method of forming these monocrystalline silicon layers will be described later. The part 43' of the monocrystalline silicon layer is connected to the bit line 43. A second insulating film 9 is then formed over the monocrystalline silicon layer, and the writing gate 44 is deposited above the monocrystalline silicon layer 8, to complete the writing transistor. An n-type impurity is doped into the part of the monocrystalline silicon layer which will be the floating gate 46 and into the part which is connected to the bit line 43. After forming the third insulating film 10, the gate 45 which will act as the reading word line is formed. The writing and readings gate may, of course, be formed simultaneously.

Several methods are available for forming the monocrystalline silicon layer 8, 43', 46 on the insulating film 7. One of these methods involves first forming a polycrystalline silicon layer over the insulating film 7 and then changing it to monocrystalline silicon by the radiation of a laser or electron rays. Another method involves the implantation of oxygen into a monocrystalline silicon substrate to form an oxidized film. Needless to say, the monocrystalline silicon layer used for this memory cell can be formed by either of these methods.

Figure 9:
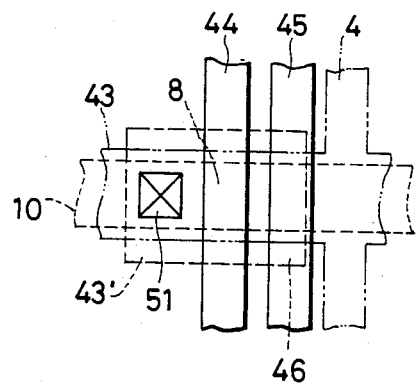
FIGS. 9 and 11 are plan views of layout patterns of the memory cells of the present invention.

FIG. 9 is a plan view of the memory cell of FIG. 8. In this embodiment, the reading word line 45, the writing word line 44, and the diffusion layer 4 are arranged in the longitudinal direction, and metal wiring 10 acting as the bit line is arranged in the transverse direction and is connected to the impurity-doped layer 43 by a contact 51. The metal wiring 10 is also connected to the monocrystalline silicon layer 43'.

Figure 10:
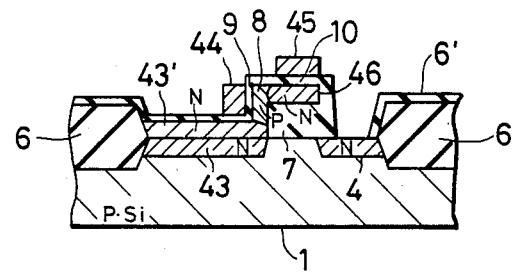

FIG. 10 shows an improvement to the structure of FIG. 8, in which the writing transistor is formed longitudinally on the side surface of the monocrystalline silicon layer 8. This structure provides the effect that the memory cell area can be reduced to less than that of the structure of FIG. 8.

Figure 11:
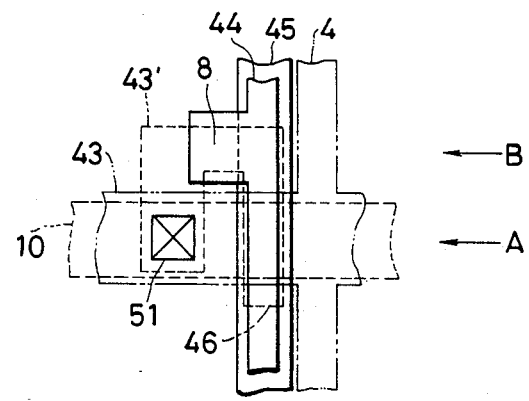
Figure 12A:
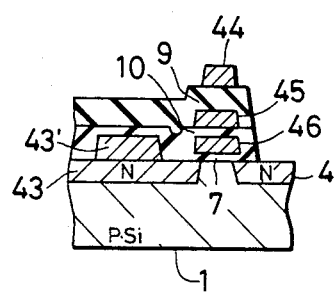
Figure 12B:
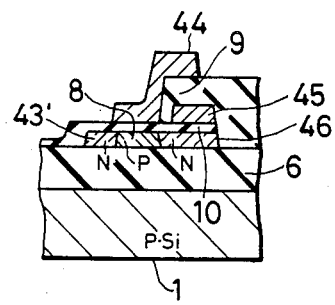

FIG. 11 shows an improvement to the layout shown in FIG. 9. This structure is characterized in that the writing transistor 41 is arranged on top of the isolation insulating film. This structure provides the effect that unstable phenomena such as a leakage currents from the reverse surface of the monocrystalline silicon layer 8, 43', 46 over the insulating film, that is, on the substrate side, can be prevented. In this embodiment, the writing word line 44 is superimposed on the reading word line 45. Needless to say, this arrangement can reduce the memory cell area. FIG. 12A is a section taken in the direction of arrow A in FIG. 11, and FIG. 12B is a section taken in the direction of along arrow B.

Figure 1A:
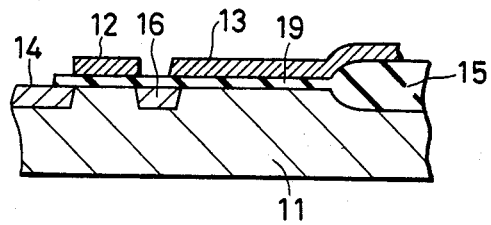
FIGS. 1A and 1B show the structure of a DRAM.
Figure 1B:
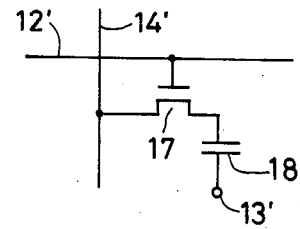
Figure 2A:
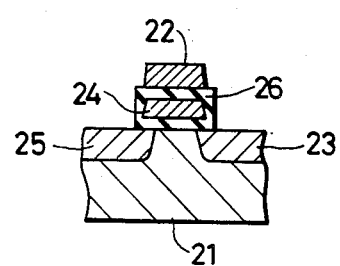
FIGS. 2A and 2B show the structure of an EPROM.
Figure 2B:
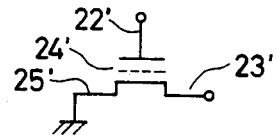
Figure 3:
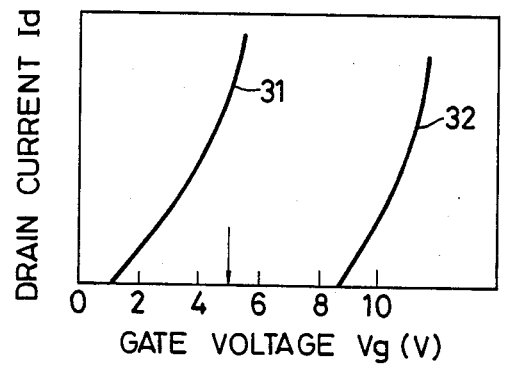
FIG. 3 shows the operating principle of an EPROM.

With this layout, the size of a unit cell is between four to five times the minimum working dimension in both the longitudinal and transverse directions. If the minimum working dimension is 2 to 3 $\mu$m, for example, the area of a unit cell is about 80 $\mu m^2$. This value is substantially equal to the area of the DRAM shown in FIG. 1 for the same working dimension. Accordingly, the memory cell of this embodiment can be scaled down to substantially the same size as a DRAM, but it is completely free of any disadvantages that might result from such a reduction in scale.

As described above, the present invention can provide a memory cell which has a charge-current conversion function, isolation of the charge storage portion from the substrate, and a non-destructive read-out function. For these reasons, the memory cell of the present invention can provide non-destructive and static read-out from an area substantially equal to that of a conventional DRAM, can be advantageously scaled-down, and is highly resistant to radioactivity such as $\alpha$-rays.

What is claimed is:

1. A semiconductor memory including a plurality of memory cells arranged in a matrix with each of said memory cells being coupled to one of a plurality of first word lines for said memory, one of a plurality of second word lines of said memory and one of a plurality of bit lines for said memory, and further including a semiconductor substrate having a first conductivity type and at least first and second surface regions that are disposed in adjacent portions of said substrate, wherein said first and second surface regions are separated from one another by an oxide film for isolation, wherein each of said first and second surface regions has a memory cell formed therein, and wherein each of said memory cells comprises:
   an insulated-gate field effect transistor having a source and drain region formed by semiconductor regions in a semiconductor layer over said substrate, a first insulating film formed on a surface region of said semiconductor layer which is disposed between source and drain regions, and a gate electrode formed on said first insulating film connected to said first line; and a memory element formed on said semiconductor substrate adjacent to said insulated-gate field effect transistor having a source and drain region formed by semiconductor regions in said substrate, wherein one of said source or drain regions of said memory element is connected to said bit line, and the other of said drain or source regions of said memory element is connected to a predetermined potential, a second insulating film formed on said semiconductor substrate which extends over a surface region of said substrate between said source and drain regions of said memory element, wherein said semiconductor layer extends over said second insulating film to form a first electrode serving as a floating gate of said memory element connected to one of said drain or source regions of said insulated-gate field effect transistor, a third insulating film formed on said first electrode, and a second electrode serving as a control gate of said memory element formed on said third insulating film connected to said second word line, wherein a portion of said memory element is stacked on a portion of said insulated-gate field effect transistor, and further wherein at least a portion of said insulated-gate field effect transistor is formed on a fourth insulating film which is formed by the same process as said second insulating film.

2. The semiconductor memory as defined in claim 1, wherein said first electrode and one of said drain or source regions of said insulated-gate field effect transistor are the same semiconductor region.

3. The semiconductor memory as defined in claim 1, wherein said predetermined potential is either a ground potential or a power source potential.

4. The semiconductor memory as defined in claim 1, wherein the other of said drain or source regions of said insulated-gate field effect transistor is connected to said bit line.

5. The semiconductor memory as defined in claim 4, wherein said second electrode of said memory element is connected to the gate of said insulated-gate field effect transistor.

6. The semiconductor memory as defined in claim 1, which includes means for turning on said insulated-gate field effect transistor in a mode for writing data into said memory element, and for turning off said insulated-gate field effect transistor in a mode for reading data from said memory element.

7. The semiconductor memory as defined in claim 1, which includes means for applying a predetermined voltage to the second electrode of said memory element in a mode for reading data from said memory element, and means for identifying whether said memory element is turned on or off.

8. The semiconductor memory as defined in claim 1, which includes means for storing or discharging charge to the first electrode of said memory element through said insulated-gate field effect transistor which has been turned on, in a mode for writing data into said memory element.

9. The semiconductor memory as defined in claim 1, wherein said insulated-gate field effect transistor is an MOS (Metal-Oxide Semiconductor) transistor.

10. The semiconductor memory as defined in claim 1, wherein said surface region of said insulated-gate field effect transistor is formed to extend in a vertical direction perpendicular to said source and drain regions of said insulated-gate field effect transistor, and further wherein said channel region extends on a vertical side surface of said fourth insulating field.

11. A semiconductor memory including a plurality of memory cells arranged in a matrix with each of said memory cells being coupled to one of a plurality of first word lines for said memory, one of a plurality of second word lines for said memory and one of a plurality of bit lines for said memory, and further including a semiconductor substrate having a first conductivity type and at least first and second surface regions that are disposed in adjacent portions of said substrate, wherein said first and second surface regions are separated from one another by an oxide film for isolation, wherein each of said first and second surface regions has a memory cell formed therein, and wherein each of said memory cells comprises:

an insulated-gate field effect transistor having a source and drain region formed by semiconductor regions in a semiconductor layer over said substrate, a first insulating film formed on a surface region of said semiconductor layer which is disposed between source and drain regions, and a gate electrode formed on said first insulating film connected to said first line; and a memory element formed on said semiconductor substrate adjacent to said insulated-gage field effect transistor having a source and drain region formed by semiconductor regions in said substrate, wherein one of said source or drain regions of said memory element is connected to said bit lines, and the other of said drain or source regions of said memory element is connected to a predetermined potential, a second insulating film formed on a surface region of said semiconductor substrate between said source and drain regions of said memory element, wherein said semiconductor layer extends over said second insulating film to form a first electrode serving as a floating gate of said memory element connected to one of said drain or source regions of said insulated-gate field effect transistor, a third insulating film formed on said first electrode, and a second electrode serving as a control gate of said memory element formed on said third insulating film connected to said second word line, wherein said insulated-gate field effect transistor is formed so that said source and drain thereof and a channel region extending between said source and drain are formed on said oxide film.

* * * * *